United States Patent
Oblak et al.

(10) Patent No.: US 6,426,679 B1
(45) Date of Patent: Jul. 30, 2002

(54) MINIATURE, LOW POWER ATOMIC FREQUENCY STANDARD WITH IMPROVED RF FREQUENCY SYNTHESIZER

(75) Inventors: Tod A. Oblak; Harvey C. Nathanson, both of Pittsburgh, PA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/737,723

(22) Filed: Dec. 14, 2000

(51) Int. Cl.[7] .................................................. H01S 3/13
(52) U.S. Cl. .......................................... 331/3; 331/94.1
(58) Field of Search ...................... 331/3, 94.1; 372/32; 324/304

(56) References Cited

U.S. PATENT DOCUMENTS

| | | | |
|---|---|---|---|
| 5,148,437 A | * | 9/1992 | Ohtsu |
| 5,192,921 A | | 3/1993 | Chantry et al. ................. 331/3 |
| 5,327,105 A | | 7/1994 | Lieberman et al. ......... 331/94.1 |
| 5,606,291 A | | 2/1997 | Verbanets ....................... 331/3 |
| 5,852,386 A | | 12/1998 | Chantry et al. ............. 331/94.1 |

* cited by examiner

Primary Examiner—Arnold Kinkead

(57) ABSTRACT

An atomic clock of the type having a cell filled with an active vapor through which is projected a light beam. A detector of the projected light provides corresponding detector signals to a microprocessor. An rf frequency synthesizer provides a microwave signal to a microwave cavity adjacent the cell and also provides a clock standard output signal. The rf frequency synthesizer includes a fractional-N frequency synthesizer which compares signals from a voltage controlled crystal reference oscillator and a voltage controlled oscillator. The fractional-N frequency synthesizer is operable to provide an output control signal to precisely lock the voltage controlled oscillator microwave output signal with the voltage controlled crystal reference oscillator signal. The fractional-N frequency synthesizer also periodically causes a predetermined desired dither in the microwave signal.

11 Claims, 6 Drawing Sheets

MINIATURE, LOW POWER ATOMIC FREQUENCY STANDARD WITH IMPROVED RF FREQUENCY SYNTHESIZER

BACKGROUND OF THE INVENTION

1. Field of the Invention

The invention in general relates to frequency standards, and more particularly to an atomic clock of the type which utilizes an optically pumped cell containing a vapor.

2. Description of Related Art

Atomic clocks are utilized in various systems which require extremely accurate and stable frequencies, such as in a GPS (global positioning system) and other navigation and positioning systems, as well as in cellular phone systems and scientific experiments, by way of example.

In one type of atomic clock, a cell containing an active medium such as cesium (or rubidium) vapor is irradiated with both optical and microwave power whereby light from an optical source pumps the atoms of the vapor from a ground state to a higher state from which they fall to a state which is at a hyperfine wavelength above the ground state. The microwave signal is tuned to a particular frequency so as to repopulate the ground state. In this manner a controlled amount of the light is propagated through the cell and is detected by means of a photodetector.

In order to precisely control the frequency, the wavelength of the propagated light is periodically dithered, that is, varied by small positive and negative amounts, to achieve a dip, which results in a minimum output signal from the detector. Likewise, the microwave signal is also dithered to obtain a microwave induced dip in the detected optical signal. By comparing output signals during a dither, a control means ensures that the wavelength of the propagated light and microwave frequency are precisely controlled. This operation, as well as further details of an atomic clock is more fully described in U.S. Pat. Nos. 5,606,291 and 5,852,386, both assigned to the assignee of the present invention and both of which are hereby incorporated by reference.

There is a need, both in the military and civilian sectors, for an ultra small, highly accurate and extremely low power atomic clock which is frequency fine tunable to account for slight variations from cell to cell. Current models do not meet all of these requirements.

SUMMARY OF THE INVENTION

The improved atomic frequency standard of the present invention includes a cell having an active medium and through which is projected a beam of light. A detector of the projected light provides corresponding detector signals to a microprocessor which generates and provides various control signals.

The arrangement includes a microwave cavity adjacent the cell, and a frequency synthesizer operable to provide a microwave signal to the cavity, as well as to provide an output time standard signal.

The frequency synthesizer includes a reference oscillator which provides a reference signal and a voltage controlled oscillator which provides the microwave signal. A fractional-N frequency synthesizer compares an indication of the reference signal with a fractionally divided indication of the voltage controlled oscillator signal. The fractional-N frequency synthesizer provides an output signal which controls the voltage controlled oscillator and varies its frequency as a result of the comparison. The arrangement precisely locks the frequency of the voltage controlled oscillator with the reference oscillator, the output of which may constitute the clock standard output signal.

DESCRIPTION OF THE PREFERRED EMBODIMENT

Figure 1:
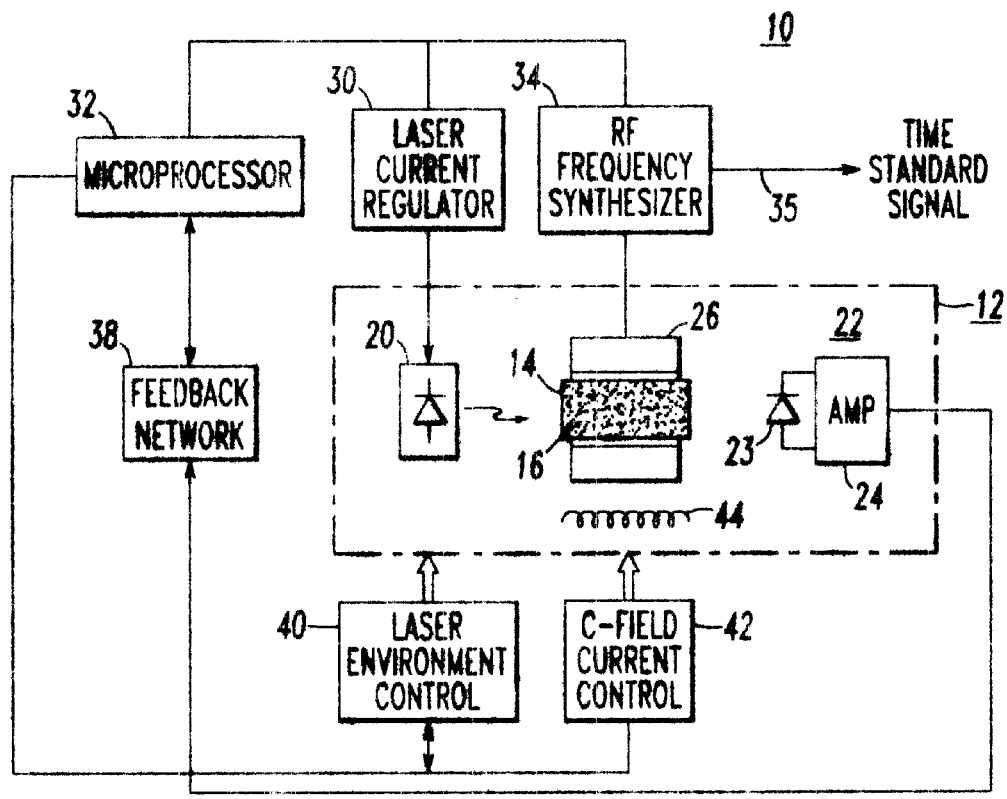
FIG. 1 is a block diagram of a cell type atomic clock.

In the drawings, which are not necessarily to scale, like or corresponding parts are denoted by like or corresponding reference numerals.

FIG. 1 basically illustrates an atomic frequency standard, or atomic clock, 10, of the type which includes a physics package 12 having a cell 14 filled with an active medium 16 such as a vapor of cesium or rubidium.

An optical pumping means, such as a laser diode 20 is operable to transmit a light beam of a particular wavelength through the active medium 16, which is excited to a higher state. Absorption of the light in pumping the atoms of the vapor to the higher states is sensed by a detector 22, comprised of photodetector 23 and amplifier 24, which provides an output signal proportional to the impinging light beam.

Adjacent the cell 14 is a microwave cavity 26, which couples a precisely controlled rf (radio frequency) signal to cell 14. The rf signal is tuned to the microwave atomic transition frequency of the vapor 16 so that the ground state is repopulated, the laser diode continuously pumps the vapor and the detector signal is further reduced.

Control of the laser diode 20 is accomplished with the provision of laser current regulator 30 which supplies the diode 20 with a certain current to generate the particular wavelength light beam in response to control signals from a digital control means such as microprocessor 32. Similarly, an rf frequency synthesizer module 34 receives control signals from microprocessor 32 to generate a precise rf microwave signal for application to the microwave cavity 26. In addition, the rf frequency synthesizer 34 provides an output signal at 35, which is the desired clock output, having extremely high stability.

Control signals provided by microprocessor 32 are generated in response to output signals from detector 22, suitably conditioned, including analog to digital conversion, by feedback network 38.

The apparatus of FIG. 1 also includes a laser diode environment control means 40, in communication with temperature sensors and heaters (not shown) for accurately maintaining diode temperature. In addition, a C-field current control 42, in conjunction with a coil 44 regulates a magnetic field within the physics package 12. Both the control means 40 and C-field current control 42 are operable in response to control signals provided by microprocessor 32.

The response of the detector 22 to the light passing through the cell 14 exhibits a dip at the exact wavelength at which the vapor atoms are pumped to the higher state. The microwave frequency must also be at the precise hyperfine frequency to produce the maximum absorption of light, and therefore, a minimum detector signal.

Figure 2A:
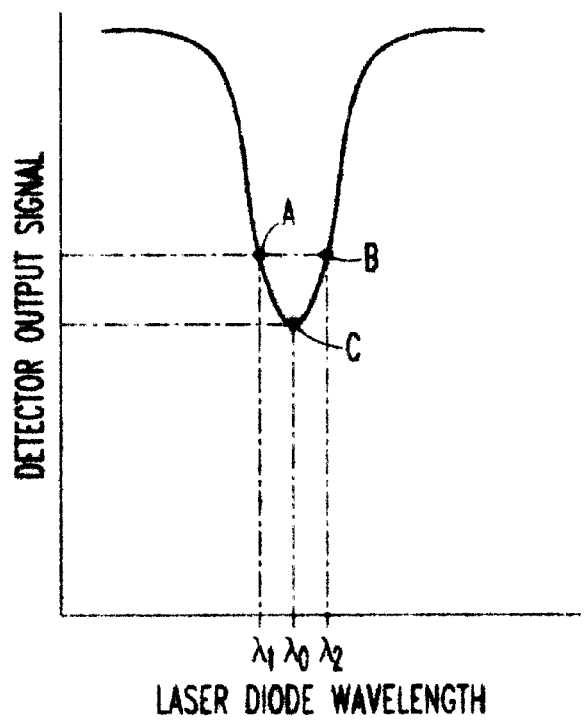
FIGS. 2A and 2B illustrate the process of dithering.
Figure 2B:
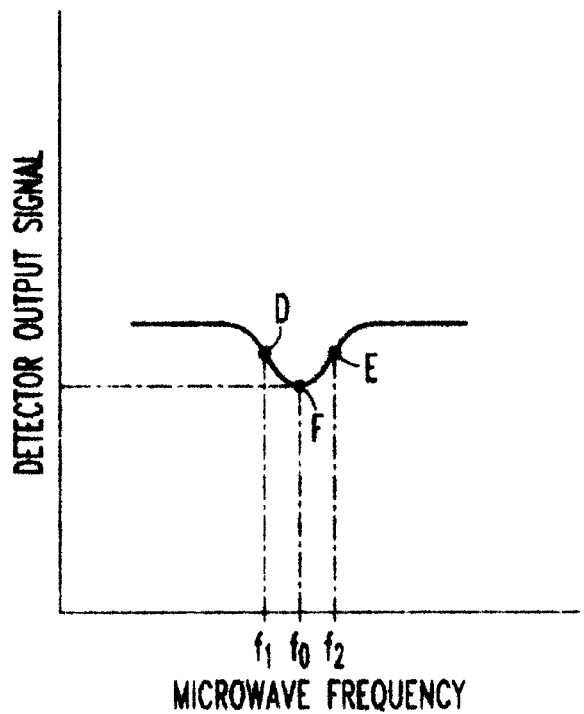

These effects on the output signal of detector 22 are illustrated in FIG. 2A, showing the relationship between the detector 22 output signal and light wavelength, and FIG. 2B, showing the relationship between the detector signal and microwave frequency.

In FIG. 2A, the precise desired wavelength is $\lambda_0$ which results in a detector signal corresponding to point C. During periodic time segments of the operation of microprocessor 32, the current to the laser diode 20 is dithered to cause the wavelength to vary between $\lambda_1$ and $\lambda_2$, corresponding to respective points A and B. If the outputs at A and B are equal, then C is the proper dip minimum and correct laser wavelength. If the outputs are not equal, then the laser diode current is varied to bring operation back to the proper point.

In different periodic time segments of the operation of microprocessor 32, and as seen in FIG. 2B, the microwave signal of frequency $f_0$ results in a detector signal corresponding to point F. The microwave signal is dithered around the correct value, $f_0$, to produce $f_1$ and $f_2$, corresponding to points D and E. If the outputs at D and E are equal, then F is the proper dip minimum and $f_0$ the correct frequency. If the outputs are not equal, then the apparatus is operable to bring operation back to the proper point. This dithering of the wavelength and frequency is described in more detail in the previously mentioned patents.

For purposes of illustration, in the following discussion, the atomic clock will be of the cesium vapor variety, providing a clock standard output frequency of 10 MHz and a microwave signal of, nominally, 9,192,631,770 Hz ("9.192 GHz" for brevity), the resonance frequency at which cesium transitions from one state to another.

Figure 3:
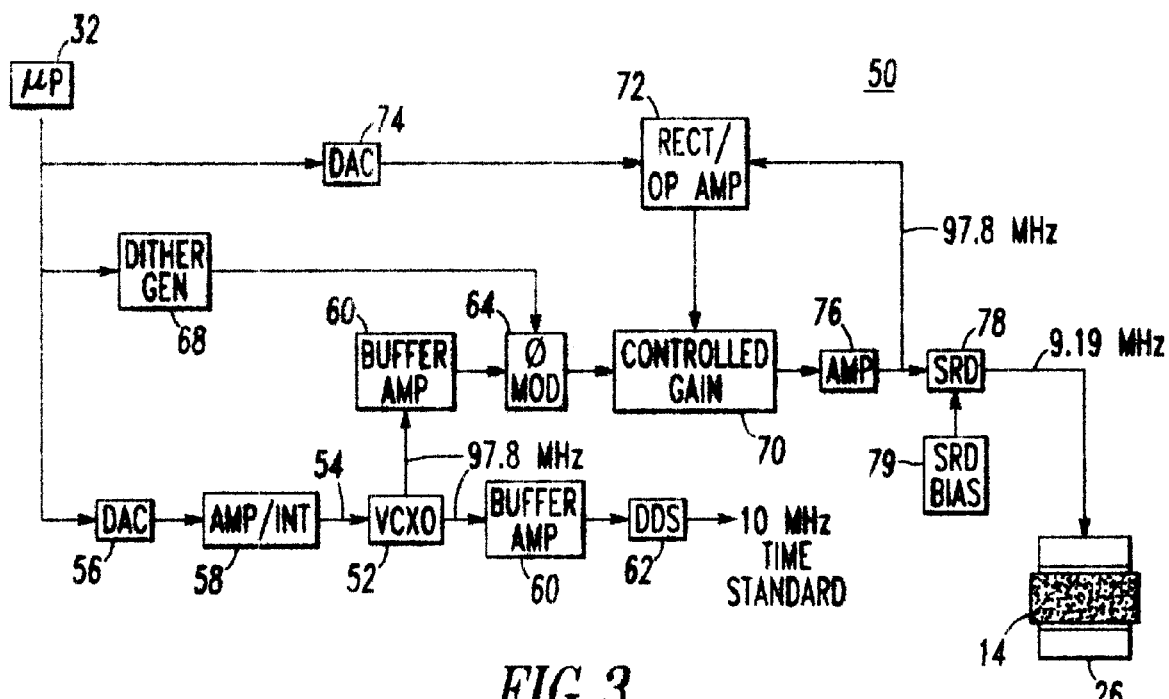
FIGS. 3 and 4 are block diagrams of atomic clock rf modules of the prior art.

FIG. 3 illustrates one typical prior art rf frequency synthesizer module 50, corresponding to rf frequency synthesizer 34 of FIG. 1. A 97.793955 MHz ("97.8 MHz" for brevity) voltage controlled crystal oscillator (VCXO) 52 receives, at input 54, a control signal from the microprocessor 32 suitably converted to analog form by digital-to-analog converter (DAC) 56 and processed by an amplifier/integrator 58. After buffering in amplifier 60, the VCXO signal is directed to a direct digital synthesizer 62 for the purpose of generating a standard 10 MHz clock output.

The output of the VCXO 52 is also provided to phase modulator 64, after buffering in amplifier 66, and which additionally receives a dither signal from dither generator 68. The output of phase modulator 64 is sent to a controlled gain stage 70 where the power level is controlled by the rectifier and op amp circuit 72. This operation helps to regulate the rf power level of the rf frequency synthesizer 50, as well as compensate for undesired amplitude modulation effects caused by the phase modulator 64. The power set point for the rectifier and op amp circuit 72 is received from the microprocessor 32 and converted to usable form by the DAC 74.

The fixed level signal is sent to a final amplifier 76, which is nominally run as a class C amplifier for best power efficiency. The modulated 97.8 MHz signal is sent to a SRD (step recovery diode) module 78, along with a bias control signal from circuit 79. The $94^{th}$ harmonic generated by the SRD 78 is extracted and represents the desired 9.192 GHz signal which is applied to the microwave cavity 26.

With an active phase modulator circuit 64 and enough power, the rf frequency synthesizer 50 is very precise. However, with an objective of small size and low power, a passive phase modulator must be used. These passive phase modulator circuits are very temperature sensitive and can lead to instability. Replacement of the class C amplifier 76 with a linear class A amplifier improves performance but increases overall power consumption to about 600 mwatts (milliwatts), which exceeds a design goal of around 100 to 200 mwatts.

In addition, instead of the 97.8 MHz VCXO 52, it would be desirable to be able to use a standard 10 MHz VCXO due to its commercial availability, low cost and ability for its output signal to be easily converted to other frequencies. The use of the SRD module 78 and its bias circuit, wherein the $94^{th}$ harmonic of the 97.8 MHz signal is derived, also represents a waste of power due to the poor conversion efficiency for the $94^{th}$ harmonic.

Figure 4:
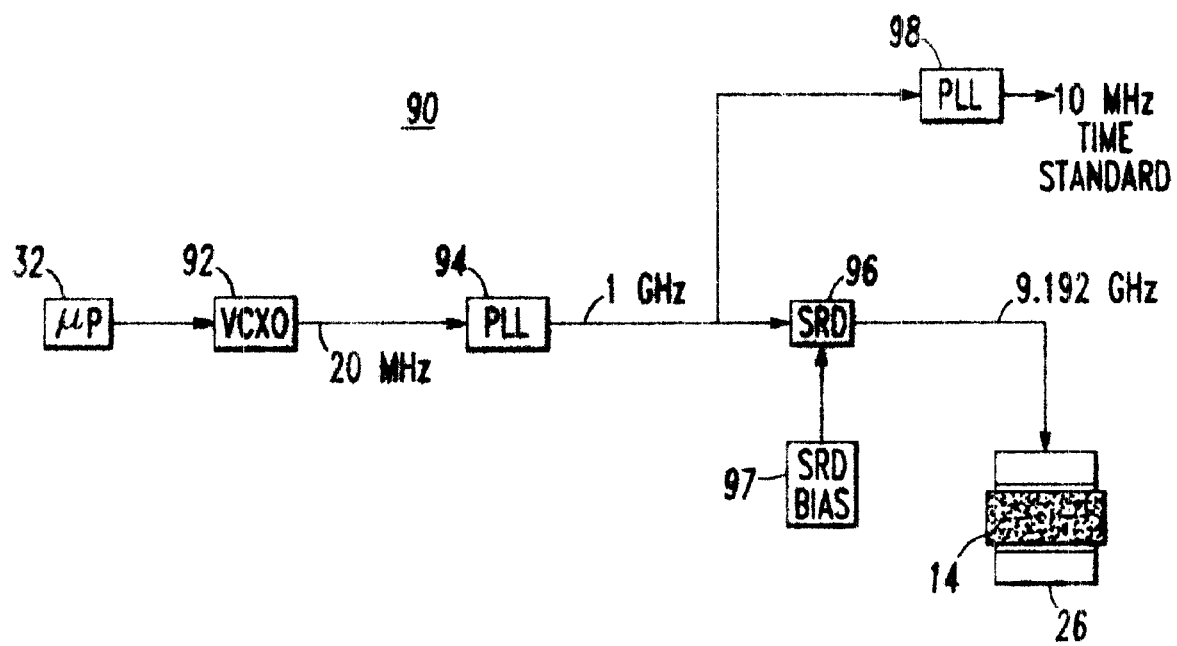

Another type of rf frequency synthesizer 90 is illustrated in FIG. 4. VCXO 92, which operates at approximately 20 MHz, receives a suitably converted input signal from the microprocessor 32 and feeds a first PLL (phase locked loop) 94. The approximate 1 GHz output of PLL 92 is provided to SRD module 96, having a bias circuit 97, and generates the requires microwave cavity signal of 9.192 GHz. The circuit additionally requires a second PLL 98 to generate the desired precise 10 MHz time standard signal.

In addition to the inefficiency problems associated with the SRD module 96, the required use of two PLLs 94 and 98 significantly increases cost and power consumption of the atomic clock. Further, the PLL 94 cannot be easily fine tuned to produce slightly different output signals to accommodate for slight variations in different cells which may be selected for use.

Figure 5:
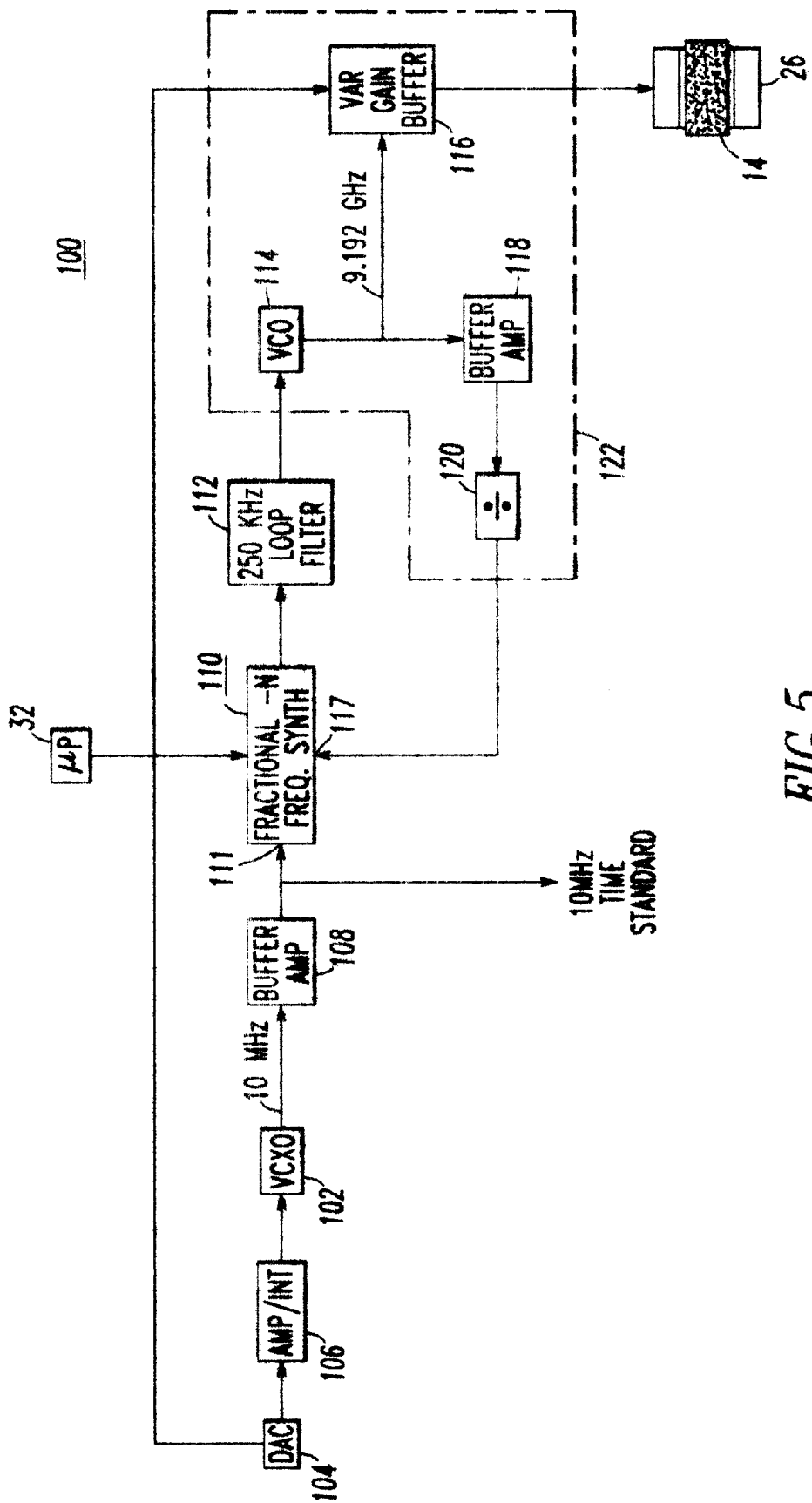
FIG. 5 is a block diagram of a preferred embodiment of the present invention.

An improved rf frequency synthesizer for an atomic clock, in accordance with the present invention is illustrated in FIG. 5. The rf frequency synthesizer module 100 is capable of fine tuning the microwave signal to accommodate for different cell frequency variations, is extremely stable and uses relatively low power, on the order of 100 to 200 mwatts, or lower. The latter feature is extremely important, particularly in military and commercial applications where portable time is required over periods of days.

The rf frequency synthesizer 100 includes a commercially available, inexpensive 10 MHz VCXO 102 which receives an error signal required to lock the VCXO 102 to the atomic resonance frequency of 9.192 GHz applied to the microwave cavity 26. The error signal, from the microprocessor 32, is converted to analog form by DAC 104, the output of which is amplified and integrated in circuit 106.

Buffer amplifier 108, connected to the output of VCXO 102 provides the stable 10 MHz time standard signal. The buffered VCXO output is also applied, as the reference frequency, to a fractional-N frequency synthesizer 110, at first input 111. This fractional-N frequency synthesizer 110, also known to those skilled in the art as a fractional-N division synthesizer or fractional-N synthesizer, is part of a single loop PLL, which includes a 250 KHz loop filter 112 driving a VCO (voltage controlled oscillator) 114, which provides the required 9.192 GHz for the microwave cavity 26. For better power management, the VCO output signal is passed through a variable gain buffer amplifier 116, under control of the microprocessor 32.

The VCO output signal is also fed back to a second input, 117, of the fractional-N frequency synthesizer 100 via a buffer amplifier 118. If the frequency of the fed back signal is too high to be accommodated by the particular fractional-N frequency synthesizer 100 used, then the frequency can be scaled down by a divider 120 to the appropriate range. For example, let it be assumed that the fractional-N frequency synthesizer 100 at input 117 can receive a signal having a frequency of 2.5 GHz, or less. The 9.192 GHz fed back signal, being too high in frequency, is brought into the proper range of approximately 2.3 GHz by a divide by 4 divider 120.

The various electronic components which comprise the VCO 114, buffer amplifier 116, buffer 118, and division circuit 120, may be implemented as a low-cost silicon based integrated circuit chip 122. For example, the preferred fabrication for IC chip 122 is with silicon germanium carbon, which operates easily at 10 GHz. The silicon germanium carbon chip 122 results in a low-power, small-sized low-cost rf synthesizer module 100.

A typical digital fractional-N frequency synthesizer 110 allows variable integer and fractional division of the input signal at 117 (an indication of the VCO signal), with the fractional part being adjustable over a $2^{18}$ range.

Figure 6:
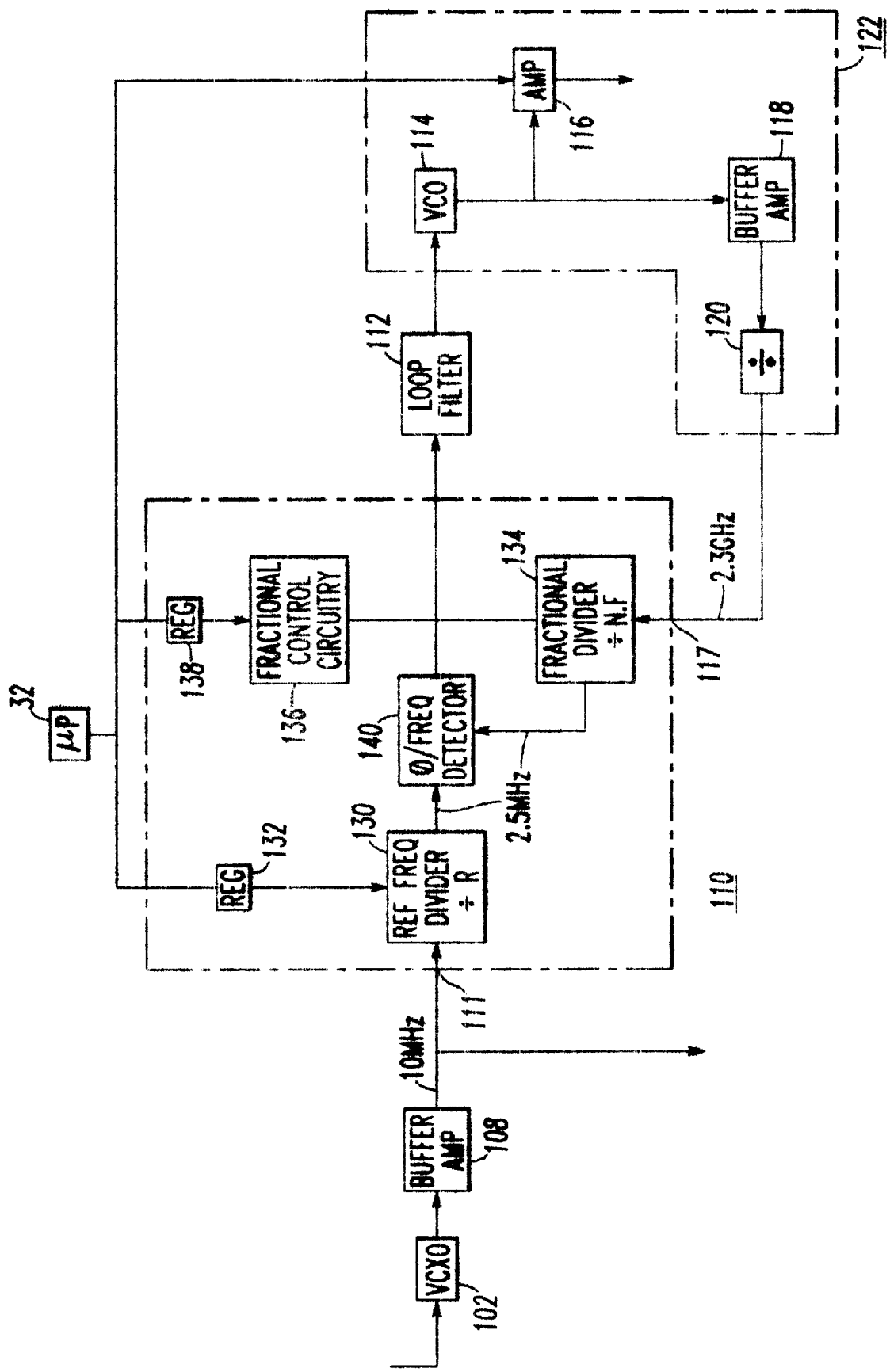
FIG. 6 illustrates the fractional-N frequency synthesizer of FIG. 5 in more detail.

A simplified functional block diagram of a typical digital fractional-N frequency synthesizer 110 is illustrated in FIG. 6, using the frequency examples discussed. The reference frequency of 10 MHz at first input 111 is divided by R (a whole integer) in the reference frequency divider 130, where R is 4. The value of R is determined by the microprocessor 32 and provided to register bank 132 to set the integer reference frequency divider 130.

The fed back output signal from the VCO 114 at second input 117 (via divider 120 if needed) is provided to fractional divider 134, which performs division by N.F where N is an integer and F is a fractional value, typically adjustable over a $2^{18}$ range. The division by N.F, to obtain a signal of frequency 2.5 MHz to match that of frequency divider 130, is under control of the fractional control circuitry 136, which is provided with appropriate data from the microprocessor 32, loaded into register bank 138.

A phase/frequency detector 140 compares the phase of the nominally correct 2.5 MHz signal from divider 130, and the nominally correct 2.5 MHz signal from fractional divider 134. Any difference in phase of these two signals produces an error signal, which, after filtering in loop filter 112, varies the frequency of the VCO 114 to bring it back to the exact 9.192 GHz value. Fractional-N frequency synthesizers are well known and are commercially available, for example, from Philsar Semiconductor Inc. of Ontario Canada or Synergy Microwave Corp. of Patterson N.J.

Basically, the apparatus of FIG. 6 operates as a self correcting loop mechanism whereby the VCXO 102 is driven, by control signals from the microprocessor 32, to be locked to the stable 9.192 GHz microwave output signal from the VCO 114, the latter signal being locked at the microwave dip point (point F, FIG. 2B) corresponding to the cesium cell atomic resonance.

When in lock, the two inputs to the phase/frequency detector 140 are the same frequency. The output of phase/frequency detector 140 is a dc voltage which holds the VCO 114 at the precise desired frequency.

More particularly, the phase/frequency detector 140 output is a signal proportional to the phase difference between the indication of the reference signal (10 MHZ divided by R=2.5 MHz) and the indication of the VCO microwave signal applied to input 117, needed to maintain the microwave signal at the 9.192 GHZ value.

The bandwidth of the loop filter 112 is fairly wide at 250 KHz which is 1/10 of the compared reference frequency of 2.5 MHz. This wide bandwidth is desired in order to reduce any phase noise presented to the VCO 114. A very low noise VCO could be used, however, these are difficult to manufacture and are more costly.

The correct control signals are determined by the microprocessor 32 as a result of dithering the microwave signal by, for example, +/−approximately 300 Hz, as set out in the referenced patents. This dithering may be accomplished with the present invention simply through the adjustment of the fractional-N division ratio. For example, by merely changing the fractional division count by +/−8 bits as input to register bank 138 by microprocessor 32, a dither of approximately +/−304 Hz is achieved. Prior to the present invention, dithering required additional circuitry such as a passive phase modulation circuit, as well as triangle wave generators. This added circuitry takes up valuable space and adds to the overall cost of the rf frequency synthesizer module.

In the present example, with the fractional value F being adjustable over a $2^{18}$ range, the VCO 114 output, of nominally 9.192 GHz, may be varied and controlled in approximately 38 Hz steps. This would allow for using cells which may differ slightly in resonant frequency, due to variations in manufacture.

Figure 7:
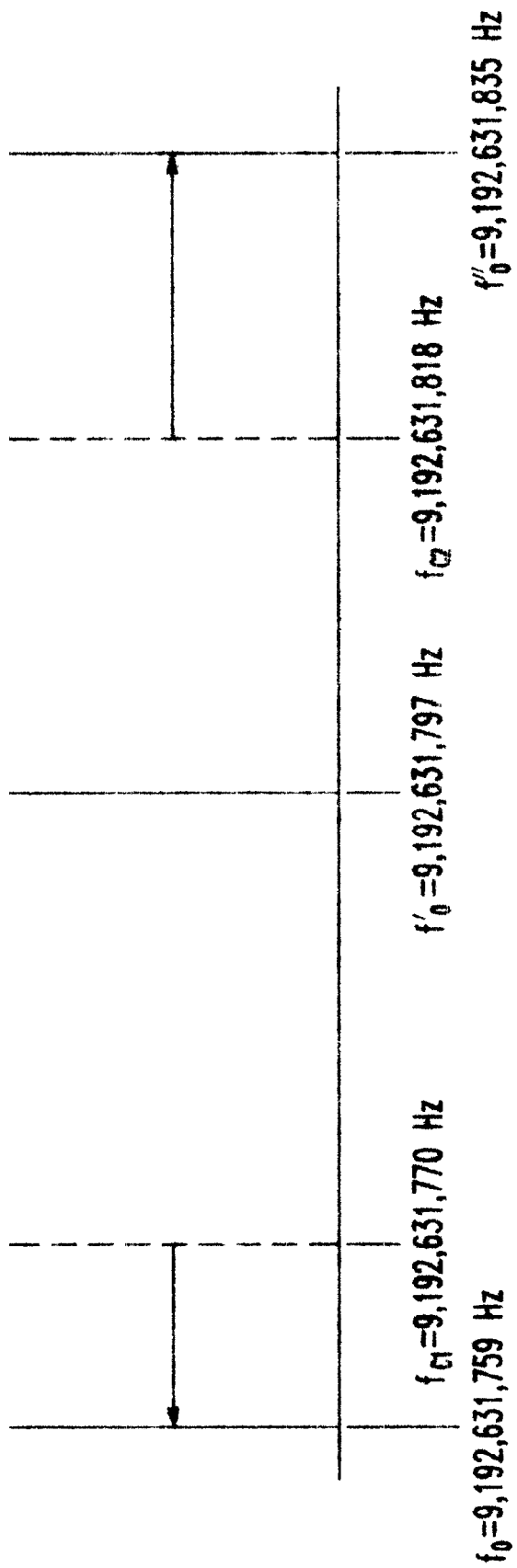
FIG. 7 illustrates the concept of fine tuning achievable with the present invention.

More particularly, and with reference to FIG. 7, let it be assumed that a particular cell is resonant at $f_{c1}$, where $f_{c1}$=9,192,631,770 Hz. The closest frequency which can be generated by the VCO 114 in 38 Hz steps and still maintain lock with the VCXO 112, is at $f_0$=9,192, 631,759.

By an adjustment of the magnetic field current (by circuit 42 of FIG. 1) the resonant frequency of the cell may be made to shift, within limits. By application of a certain value of magnetic field, the resonance of the cell may be adjusted and shifted to correspond to the nearest frequency, $f_0$ such that, during operation, the 10 MHz time standard output signal is locked to $f_0$.

The present invention would allow proper operation at steps of 38 Hz, such as at $f'_0$=9,192,631,797 Hz and $f''_0$=9, 192,631,835 Hz (as well as frequencies less than $f_0$. Suppose that, as result of a priori testing, a certain cell to be utilized exhibits a resonant frequency of $f_{c2}$=9,192,631,818. In a similar fashion the magnetic field may be adjusted to shift the cell's resonant frequency to the nearest value of $f''_c$.

To accomplish this small step size with a prior art PLL frequency synthesizer module, to accommodate for different cell resonances, would require the use of multiple phase locked loops, significantly adding to the cost, volume and power usage of such module.

It will be readily seen one of ordinary skill in the art that the present invention fulfills all of the objects set forth herein. After reading the foregoing specification, one of ordinary skill in the art will be able to effect various changes, substitutions of equivalents and various other aspects of the present invention as broadly disclosed herein. It is therefore intended that the protection granted hereon be limited only by the definition contained in the appended claims and equivalents. Having thus shown and described what is at present considered to be the preferred embodiment of the present invention, it should be noted that the same has been made by way of illustration and not limitation. Accordingly, all modifications, alterations and changes coming within the spirit and scope of the present invention are herein meant to be included.

What is claimed is:

1. An atomic frequency standard, comprising:
   (A) a digital control means operable to provide control signals;

(B) a physics package including a) a cell containing an active medium, b) a microwave cavity adjacent said cell, c) a light source for projecting a light beam through said cell to optically pump said active medium, and d) a detector positioned to provide output signals to said digital control means in response to said light projected through said cell;

(C) a regulator circuit operable, in response to control signals from said digital control means, for governing operation of said light source;

(D) an rf frequency synthesizer including a) a reference oscillator providing a reference signal, b) a voltage controlled oscillator providing a microwave signal, c) a fractional-N frequency synthesizer having first and second inputs, d) first means applying said reference signal to said first input, e) second means applying said microwave signal to said second input, f) said fractional-N frequency synthesizer being connected to receive control signals from said digital control means and operable to fractionally divide said signal applied to said second input and compare the results with an indication of said reference signal applied to said first input, to provide an error signal for controlling operation of said voltage controlled oscillator; and (E) means for applying said microwave signal to said microwave cavity.

2. Apparatus according to claim 1 wherein:

(A) said reference oscillator is a voltage controlled crystal oscillator which receives control signals from said digital control means.

3. Apparatus according to claim 1 wherein:

(A) said second means for applying the microwave signal to said second input includes a) a buffer amplifier and b) a divider circuit.

4. Apparatus according to claim 1 wherein:

(A) said reference signal is divided by R within said fractional-N frequency synthesizer, where R is an integer;

(B) said signal applied to said second input is divided by N.F, where N is an integer portion and F is a fractional portion.

5. Apparatus according to claim 4 which includes:

(A) a loop filter connected between said fractional-N frequency synthesizer and said voltage controlled oscillator;

(B) said loop filter has a bandwidth of approximately $\frac{1}{10}$ the value of said reference signal divided by R.

6. Apparatus according to claim 1 wherein:

(A) said fractional-N frequency synthesizer receives control signals from said digital control means to periodically vary the value of said fractional division so as to provide an output signal to said voltage controlled oscillator to cause said microwave signal to dither.

7. Apparatus according to claim 1 wherein:

(A) said fractional-N frequency synthesizer has a minimum step size of approximately 38 Hz.

8. Apparatus according to claim 1 wherein:

(A) said physics package additionally includes a) means for generating a magnetic field encompassing said cell and b) means for varying said magnetic field.

9. Apparatus according to claim 1 wherein:

(A) said means for applying said microwave signal to said microwave cavity is a variable gain amplifier.

10. Apparatus according to claim 9 wherein:

(A) said second means for applying the microwave signal to said second input includes a) a buffer amplifier and b) a divider circuit; and wherein (C) said buffer amplifier, said divider circuit, said voltage controlled oscillator and said variable gain amplifier are all fabricated on a single integrated circuit.

11. Apparatus according to claim 9 wherein:

(A) said integrated circuit is a silicon germanium carbon integrated circuit.

* * * * *